United States Patent
Halalchi

(10) Patent No.: US 12,210,052 B2
(45) Date of Patent: Jan. 28, 2025

(54) METHOD FOR DETECTING AN ELECTRICAL INSULATION FAULT BETWEEN AN ELECTRIC POWER SOURCE AND AN ELECTRICAL GROUND

(71) Applicant: RENAULT S.A.S, Boulogne-Billancourt (FR)

(72) Inventor: Houssem Halalchi, Paris (FR)

(73) Assignee: AMPERE S.A.S., Boulogne-Billancourt (FR)

( * ) Notice: Subject to any disclaimer, the term of this patent is extended or adjusted under 35 U.S.C. 154(b) by 0 days.

(21) Appl. No.: 17/996,319

(22) PCT Filed: Mar. 16, 2021

(86) PCT No.: PCT/EP2021/056592
§ 371 (c)(1),
(2) Date: Oct. 14, 2022

(87) PCT Pub. No.: WO2021/209207
PCT Pub. Date: Oct. 21, 2021

(65) Prior Publication Data
US 2023/0228802 A1 Jul. 20, 2023

(30) Foreign Application Priority Data
Apr. 14, 2020 (FR) ........................ 2003722

(51) Int. Cl.
*G01R 31/14* (2006.01)
*G01R 31/00* (2006.01)

(52) U.S. Cl.
CPC ........... *G01R 31/14* (2013.01); *G01R 31/007* (2013.01)

(58) Field of Classification Search
CPC ......... B60L 3/0069; B60L 3/12; G01R 31/02; G01R 31/025; G01R 27/02; G01R 31/007;
(Continued)

(56) References Cited

U.S. PATENT DOCUMENTS

| | | |
|---|---|---|
| 2016/0334452 A1 | 11/2016 | Mensler et al. |
| 2017/0106754 A1 | 4/2017 | Schmelzer |
| 2018/0154776 A1 | 6/2018 | Gardien et al. |

FOREIGN PATENT DOCUMENTS

| | | |
|---|---|---|
| EP | 0 654 673 A1 | 5/1995 |
| FR | 3 014 206 A1 | 6/2015 |

(Continued)

OTHER PUBLICATIONS

International Search Report issued Apr. 12, 2021 in PCT/EP2021/056592 filed on Mar. 16, 2021, 3 pages.
(Continued)

*Primary Examiner* — Son T Le
(74) *Attorney, Agent, or Firm* — Oblon, McClelland, Maier & Neustadt, L.L.P.

(57) ABSTRACT

A method detects an electrical insulation fault between an electric power source and an electrical ground, via a circuit that includes a controllable voltage generator and an electrical measuring resistor connected in series between a terminal of the electric power source and the electrical ground. The method includes controlling the voltage generator to establish, between its terminals, a non-zero voltage value, and measuring the voltage at the terminals of the electrical measuring resistor to detect an electrical insulation fault between the electric power source and the electrical ground. The method further includes a computer determining, depending at least on the voltage measured at the terminals of the electrical measuring resistor, at least two parameters characteristic of a disturbance affecting the
(Continued)

detection of the electrical insulation fault, and calculating a reliability level of the detection of the electrical insulation fault depending on at least one of the two parameters.

13 Claims, 4 Drawing Sheets

(58) Field of Classification Search
CPC ...... G01R 31/14; G01R 31/00; G01R 27/025; G01R 31/52; G01R 27/20; G01R 27/205; G01R 31/392
See application file for complete search history.

(56) References Cited

FOREIGN PATENT DOCUMENTS

| | | |
|---|---|---|
| FR | 3 037 406 A1 | 12/2016 |
| JP | 9-69879 A | 3/1997 |
| KR | 10-0999852 B1 | 12/2010 |

OTHER PUBLICATIONS

Preliminary French Search Report issued Dec. 11, 2020 in French Application 2003722 filed on Apr. 14, 2020, 3 pages (with English Translation of Categories of Cited Documents).

METHOD FOR DETECTING AN ELECTRICAL INSULATION FAULT BETWEEN AN ELECTRIC POWER SOURCE AND AN ELECTRICAL GROUND

TECHNICAL FIELD OF THE INVENTION

The present invention relates generally to the electrical safety of electrical power sources such as accumulator batteries.

It relates notably to a device for detecting an electrical insulation fault between an electrical power source and an electrical ground, this device comprising:
- a controllable voltage generator and an electrical measurement resistor connected in series between a terminal of the electrical power source and the electrical ground, and
- a means for measuring the intensity of the current circulating through the electrical measurement resistor.

The invention relates primarily to a method for detecting an electrical insulation fault, comprising steps of:
- controlling the voltage generator in such a way that it establishes, between its terminals, a voltage of non-zero value, and of
- measuring the voltage at the terminals of the electrical measurement resistor to detect an electrical insulation fault between the electrical power source and the electrical ground.

The invention is particularly advantageously applicable in electrically powered motor vehicles.

STATE OF THE ART

An electric powered motor vehicle ordinarily comprises an electric motor and an accumulator battery which is specially designed to supply the electric motor with current in order to have the vehicle advance.

Such an accumulator battery generally comprises a plurality of low-voltage cells, connected in series with one another in such a way that the overall voltage at the terminals of the battery is sufficiently high to make the vehicle advance. The voltage at the terminals of such a battery is often on the order of 400V.

Such an accumulator battery is usually controlled by a management system designed to monitor the correct operation thereof.

It is known practice, for example from the document EP0654673, to equip such a management system with a function for detecting electrical insulation faults. It would in fact be dangerous, in the event of a short circuit between the accumulator battery and the bodywork of the vehicle, to allow the situation to persist.

For that, this document EP0654673 teaches measuring an insulation resistance between the accumulator battery and the bodywork of the vehicle, using a detection circuit which comprises a controllable voltage generator and an electrical measurement resistor connected in series between a terminal of the accumulator battery and the bodywork.

It is explained that, by generating two voltage pulses, it is possible to measure two voltage values at the terminals of the electrical measurement resistor and deduce therefrom the value of the insulation resistance.

It is also explained that these voltage measurements must be performed in a stationary state. For that, this document proposes a method that makes it possible to determine when the transient state has ended, so as to be able to perform the desired measurements as early as possible.

This document further teaches that errors can affect the measurements carried out. To prevent this type of error, this document proposes calculating the arithmetic mean of the successively measured voltages and, if this mean varies too much over time, not to use the results of the measurements.

One drawback of this solution is that, in practice, it wrongly detects measurement errors, such that the time bands during which the results of the measurements are unusable are long, which can prove potentially dangerous in the event of the appearance of a short circuit.

Another drawback to this solution is that, when any electrical insulation fault is found, it does not make it possible to know precisely the accumulator cells of the battery between which the fault is located.

SUMMARY OF THE INVENTION

In order to remedy the abovementioned drawbacks of the prior art, the present invention proposes a detection method such as that defined in the introduction, but further comprising a checking step during which a computer:
- determines, as a function at least of the voltage measured at the terminals of the electrical measurement resistor, at least two parameters characteristic of a disturbance affecting the detection of the electrical insulation fault, and
- calculates a level of reliability of the detection of the electrical insulation fault as a function of at least one of the two parameters.

Thus, the invention proposes using two parameters as a basis for determining whether or not the situation prevents an insulation fault from being detected.

These parameters are both functions of the voltage measured at the terminals of the measurement resistor.

Indeed, the applicant has found that, when, in a situation in which it is not possible to reliably detect an electrical insulation fault, a characteristic signal appears at the terminals of the voltage source (the accumulator battery), which signal can for example be modeled in the form of a voltage pulse.

The appearance of such a characteristic signal can also be detected at the terminals of the measurement resistor. The use of the two abovementioned parameters then makes it possible to characterize with great reliability the appearance of such a signal so as to effectively check whether or not there is a situation in which there is a risk of wrongly detecting an electrical insulation fault.

Other advantageous and nonlimiting features of the detection method according to the invention, taken individually or in all technically possible combinations, are as follows:
- there is provided, between the measurement step and the checking step, a step of detection of the electrical insulation fault;
- the result of said detection step is used or not as a function of the calculated level of reliability;
- there is provided, after the checking step, a step of detection of the electrical insulation fault only if the level of reliability indicates that the detection of the electrical insulation will be reliable;
- to detect an electrical insulation fault, the computer calculates the value of an insulation resistance of said electrical power source with respect to the electrical ground then compares said value with a threshold;
- if an electrical insulation fault is detected, the computer calculates a coefficient of positioning of the electrical insulation fault within said electrical power source;

in the checking step, the calculation of the level of reliability is performed as a function of the two parameters;

in the checking step, the calculation of the level of reliability is performed as a function of the variation in time of at least one of the two parameters;

with the voltage generator being controlled in such a way that the voltage takes, during two successive periods, two non-zero and mutually different values, two values of the voltage at the terminals of the electrical measurement resistor are respectively measured during the two periods and each parameter is determined as a function of the two measured values;

one of the parameters is a function of the arithmetic mean between the two measured values of the voltage at the terminals of the electrical measurement resistor;

the other of the parameters is a function of the deviation between the two measured values of the voltage at the terminals of the electrical measurement resistor.

The invention relates also to a device for detecting an electrical insulation fault between an electrical power source and an electrical ground, comprising, on the one hand, a circuit which comprises a controllable voltage generator and an electrical measurement resistor connected in series between a terminal of the electrical power source and the electrical ground, and which comprises a means for measuring the intensity of the current circulating through the electrical measurement resistor, and, on the other hand, a computer suitable for implementing a detection method as specified above.

The invention relates also to a motor vehicle comprising an electrical power source, an electrical ground, and a detection device as specified above.

Obviously, the different characteristics, variants and embodiments of the invention can be associated with one another according to various combinations insofar as they are not mutually incompatible or exclusive.

DETAILED DESCRIPTION OF THE INVENTION

The description which follows in light of the attached drawings, given as nonlimiting examples, will give a good understanding as to what the invention consists of and how it can be produced.

Figure 1:
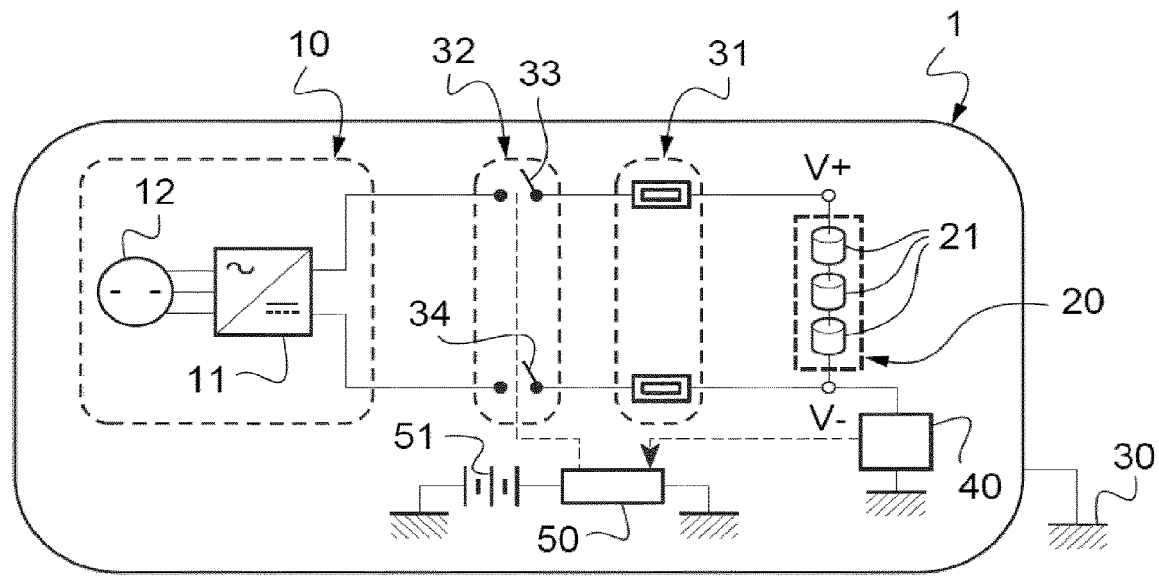
FIG. 1 is a schematic view of a motor vehicle according to the invention, comprising a DC voltage electrical source and a circuit for detecting an electrical insulation fault on this source.

In FIG. 1, an electric powered motor vehicle 1 is represented.

This motor vehicle 1 comprises an electric power train 10 which comprises, in this example, an inverter 11 and an electric motor 12. The inverter 11 is conventionally designed to convert a DC voltage into an AC voltage.

To supply the inverter 11 with the electrical current, the motor vehicle 1 comprises a DC voltage source.

This source is, here, a rechargeable accumulator battery 20.

Such an accumulator battery 20 normally comprises a housing which houses a plurality of accumulator cells 21 of small sizes, the number of which is calculated such that the electric motor can develop a torque and a power that are sufficient to propel the vehicle for a predetermined time.

In FIG. 1, for the purposes of clarity, only three accumulator cells 21 are represented.

Each cell normally has a voltage at its terminals of the order of 3 to 5 V. These cells are then connected in series to reach the voltage level required by the application. The voltage Vbat measured at the terminals of the traction battery can thus reach more than 400 V when the battery is charged.

The two terminals of the accumulator battery 20, between which all the accumulator cells 21 are connected, are called terminals $V^-$ and $V^+$.

Figure 2:
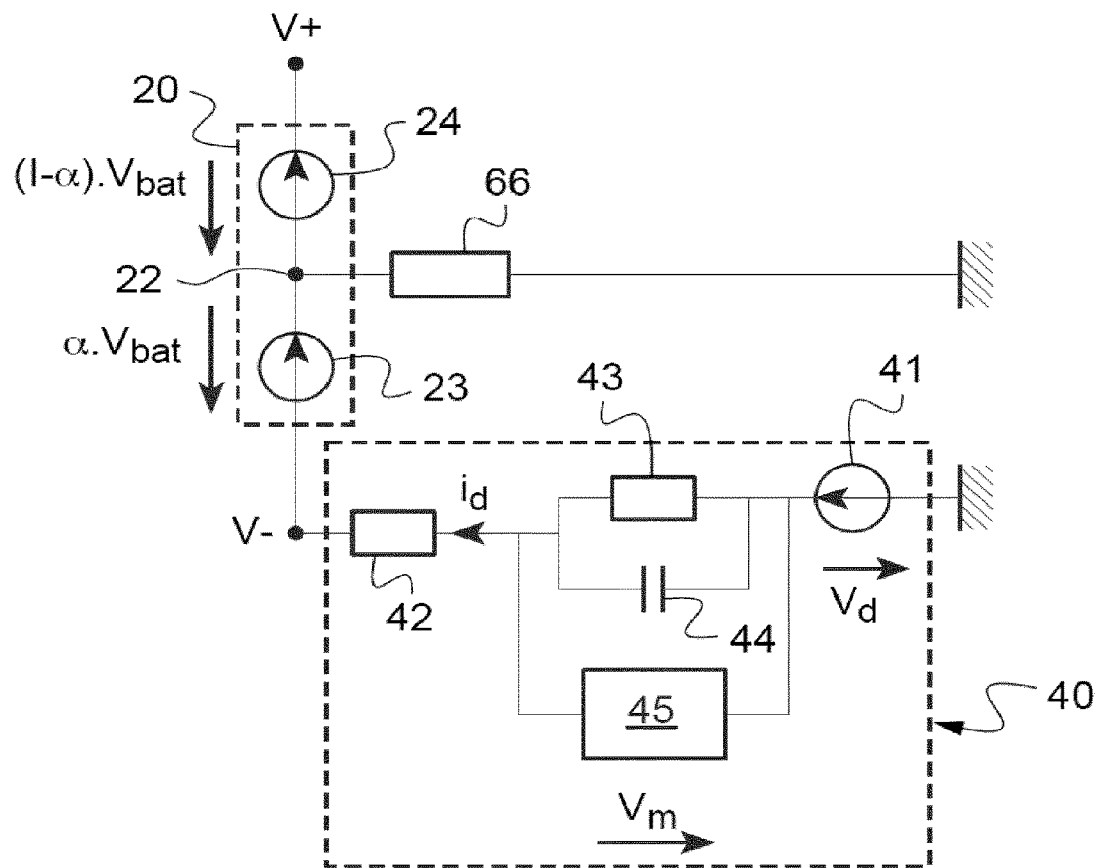
FIG. 2 is a schematic view of the detection circuit of FIG. 1.

The motor vehicle 1 also comprises a body 30, here formed by the chassis and the bodywork of this vehicle which are generally made of electrically conductive metallic material. This body 30 forms a floating electrical ground since it is not permanently electrically linked to the earth. This body 30 is illustrated in FIGS. 1 and 2 by an electrical ground symbol.

As FIG. 1 also shows, the motor vehicle 1 here also comprises, between the terminals of the accumulator battery 20 and those of the inverter 11, a protection circuit 31 and a power coupling circuit 32.

The protection circuit 31, as is known per se, includes fuses configured to break the connection upon a short circuit. Here, on each electrical line connecting one of the terminals of the accumulator battery 20 to the inverter 11, a fuse is provided. As a variant, this protection circuit could include only a single fuse.

The power coupling circuit 32 comprises at least one switch that makes it possible to connect and, alternately, selectively disconnect the terminals of the accumulator battery 20 to and from the inverter 11. In FIG. 1, this circuit is represented as comprising, on each electrical line connecting one of the terminals of the accumulator battery 20 to the inverter 11, a switch 33, 34. In practice, this power coupling circuit 32 could include only a single switch, for example connected between the terminal $V^+$ of the accumulator battery 20 and the inverter 11.

The motor vehicle 1 also comprises a system for making it possible to measure the insulation of the accumulator battery 20. This system is in practice formed by a circuit 40 for detecting an electrical insulation fault between the accumulator battery 20 and the body 30. This detection circuit 40, which will be described in detail hereinafter in this description, is electrically connected to the body 30 and to a single terminal of the accumulator battery 20, here the terminal V⁻.

The motor vehicle 1 finally comprises a battery-managing computer 50 ("battery management system" or "BMS"). This computer comprises a processor, a memory, and a data input and output interface.

Through this interface and a data exchange bus, the computer is adapted to receive information from the detection circuit 40 and it is adapted to control the switches 33, 34 of the power coupling circuit 32.

By virtue of its memory, the computer stores a computer application, composed of computer programs comprising instructions, the execution of which by the processor allows the implementation by the computer of the method described hereinbelow.

Here, this computer 50 is supplied via a DC voltage source 51 distinct from the accumulator battery 20. It is in this case a power supply battery of the onboard network of the vehicle.

In practice, when it receives from the detection circuit 40 information indicating that an electrical insulation fault has been detected, the computer 50 is programed to drive the opening of the two switches 33, 34 of the power coupling circuit 32.

An insulation fault is understood here to mean the abnormal presence of an electrical contact of low electrical resistance between the body 30 and an electrical potential point of the accumulator battery 20. This electrical potential point can be formed by one of the terminals V⁺, V⁻ of the battery, but not exclusively. It can be any zone situated between these two terminals.

Here, a resistance is said to be low if it is lower than or equal to a predefined safety threshold, for example 100 kΩ.

Because of the fixing of the accumulator battery 20 and of the loads supplied with current by this battery to the body of the vehicle, there is inevitably a so-called insulation resistance between the accumulator battery 20 and the body 30. Normally, this insulation resistance is very much greater than the abovementioned safety threshold.

FIG. 2 illustrates a single electrical insulation fault between a point 22 of the accumulator battery source 20 and the body 30. This insulation fault is reflected here by the appearance of an insulation resistance 66 which connects this point 22 and the body 30 and which exhibits a value, denoted $R_i$, lower than the abovementioned safety threshold.

In this situation, a potentially dangerous leakage current flows through this insulation resistance 66 to the body 30. Such a leakage current is undesirable and can create a hazard for a user of the motor vehicle 1 who might enter into direct contact with the body 30.

The detection circuit 40 is then specifically designed to detect such a situation. For that, it is based on a modeling of an electrical insulation fault which takes the form of the diagram of FIG. 2.

In this FIG. 2, it will be noted that the accumulator battery 20 has been represented by means of two DC voltage sources 23, 24 connected in series with one another between the terminals V⁺, V⁻, on either side of the point 22.

It can then be written that these two DC voltage sources 23, 24 respectively deliver, between their terminals, voltages $(1-\alpha)\cdot Vbat$ and $\alpha \cdot Vbat$, with α being a real number belonging to the interval [0;1].

The knowledge of this coefficient α makes it possible to accurately know the position of the fault in the accumulator battery 20.

In this FIG. 2, an embodiment of the detection circuit 40 is also represented in more detail.

It can be seen therein that this detection circuit 40 comprises:
a source 41 suitable for applying a DC voltage denoted $V_d$ between the terminal V⁻ of the accumulator battery 20 and the body 30,
a parallel RC circuit, comprising a measurement resistor 43, of a value denoted $R_m$, and a capacitor 44 of a capacitance denoted $C_m$, and
a current limiting resistor 42, of a value denoted $R_d$.

The source 41, the parallel RC circuit and the current limiting resistor 42 are connected in series between the terminal V⁻ of the accumulator battery and the body 30.

The source 41 is controlled by the computer 50 to apply a voltage $V_d$ which leads to the appearance of an electrical current $I_d$ which passes through the current limiting resistor 42.

The value $R_d$ of this resistor 52 is then chosen to be sufficiently low to facilitate the measurement of the electrical current $I_d$ while being sufficiently high not to degrade the electrical insulation of the accumulator battery 20. It is, there, at least 5 times greater than the predefined safety threshold (which, it will be recalled, is, here, 100 kΩ).

The value $R_m$ of the measurement resistor 43 is advantageously chosen such that the ratio $R_d/R_m$ lies between 1 and 100 to keep the current values $I_d$ within a narrow range.

The detection circuit 40, is, here, suitable for measuring the voltage $V_m$ at the terminals of the parallel RC circuit, by means, for example, of an analog/digital converter based on differential amplifiers, connected electrically in parallel with the parallel RC circuit. The measurement of this voltage $V_m$ amounts to measuring the current $I_d$.

To detect an electrical insulation fault of the accumulator battery 20, the computer 50 implements a looped detection method, with regular time intervals. On each loop, the computer proceeds in two phases that can be implemented in succession (in any direction) or concomitantly.

Preferentially, it implements a first phase of the method which consists in detecting a possible insulation fault. In the case where such a fault has been detected, it implements a second phase, which is more specifically the subject of the present invention, and which consists in checking that the conditions for detecting such a fault were indeed met and that the detection thus made was reliable.

To implement the first phase, the computer 50 controls the source 41 such that it applies, during a first period $T_1$, a first voltage of a value denoted $V_{d1}$, since it applies, during a second period $T_2$, a second voltage of a value denoted $V_{d2}$.

These two periods are successive. They can immediately follow one another or be separated, the time interval elapsing between these two periods having to be short.

Here, each period has a duration of the order of a second.

The applied voltage values $V_{d1}$, $V_{d2}$ are, here, different, but they are of the same polarity.

Each of these values has a corresponding current value $I_{d1}$, $I_{d2}$ and voltage $V_m$ value $V_{m1}$, $V_{m2}$.

Because of the presence of capacitors, when a voltage is applied, the current $I_d$ and the measured voltage $V_m$ first of all have a phase called transient regime, during which their values vary significantly, followed by a phase called permanent regime, during which their values are stabilized around a constant. It is preferable to wait for the permanent regime to be established to proceed to measure the voltage $V_m$ values $V_{m1}$, $V_{m2}$. In practice, the measurement of these values occurs at the end of the periods $T_1$, $T_2$.

The computer 50 then proceeds to calculate the value $R_i$ of the insulation resistance 66, by means of the following formula.

$$R_i = R_m \cdot \frac{V_{d2} - V_{d1}}{V_{m2} - V_{m1}} - (R_d + R_m) \quad \text{[Math. 1]}$$

The value of the coefficient α, for its part, is calculated by the computer 50 by means of the following formula:

$$\alpha = \frac{V_{m1} \cdot V_{d2} - V_{m2} \cdot V_{d1}}{V_{bat}(V_{m2} - V_{m1})} \quad \text{[Math. 2]}$$

In these two equations, it is assumed that the voltage $V_{bat}$ at the terminals of the accumulator battery 20 has remained constant from one period to the other.

As a variant, if there is a desire to take account of a possible variation of this voltage from one value denoted $V_{bat1}$ to another value denoted $V_{bat2}$, the following formulae can be used:

$$R_i = \frac{R_m}{V_{m2} - V_{m1}} \cdot \left[ V_{d2} - V_{d1} + \frac{(V_{bat2} - V_{bat1}) \cdot (V_{m1} \cdot V_{d2} - V_{m2} \cdot V_{d1})}{V_{m2} \cdot V_{bat1} - V_{m1} \cdot V_{bat2}} \right] - (R_d + R_m) \quad \text{[Math. 3]}$$

$$\alpha = \frac{V_{m1} \cdot V_{d2} - V_{m2} \cdot V_{d1}}{V_{bat1} \cdot V_{m2} - V_{m1} \cdot V_{bat2}} \quad \text{[Math. 4]}$$

In practice, the values taken by the measured voltage $V_m$ are generally noisy. The results of the two equations used are then filtered. Preferentially, an RLS ("recursive least squares") filter will be used in order to obtain a stable approximation of the value $R_i$ of the insulation resistance 66 and of the coefficient α

The computer then compares this value $R_i$ with the predefined safety threshold (which, here, is 100 kΩ).

As long as this value is above the threshold, no action is undertaken by the computer. Indeed, in this situation, it is estimated that the resistance is such that no leakage current is present.

Otherwise, a possible leakage current is detected, on an accumulator cell whose position can be determined by means of the coefficient α.

In this case, the computer implements the second phase of the method to check that this detection is reliable.

There are in fact situations in which the computer 50 will wrongly detect a current leak. This will hereinafter be called "risky situation".

These risky situations occur when the signal measured by the detection circuit 40 is disturbed by electronic components connected to the accumulator battery.

The second phase will therefore make it possible to check whether or not one of these risky situations applies.

These risky situations occur in the event of loss of synchronization between the voltage $V_d$ and the measured voltage $V_m$.

Before describing how this second phase is implemented in practice, two nonlimiting examples of risky situations, generating bad insulation fault detections, will first of all be described.

The first example of risky situation is linked to the switching of the switches 33, 34 of the power coupling circuit 32.

As has already been described, the closing of the switch or switches 33, 34 makes it possible to connect the accumulator battery 20 to the inverter 11. It is for example controlled each time the vehicle is started up after being parked for a long time. It therefore occurs regularly.

It is found that the closure of the switches 33, 34 is not immediate after the computer 50 has delivered a switching signal.

Thus, the transition between the "open" and "closed" states $E_T$ is not instantaneous, but is necessarily accompanied by an intermediate, so-called "transient" state, reflecting the phenomena of charging and discharging of the control coils of the switches 33, 34.

Figure 3:
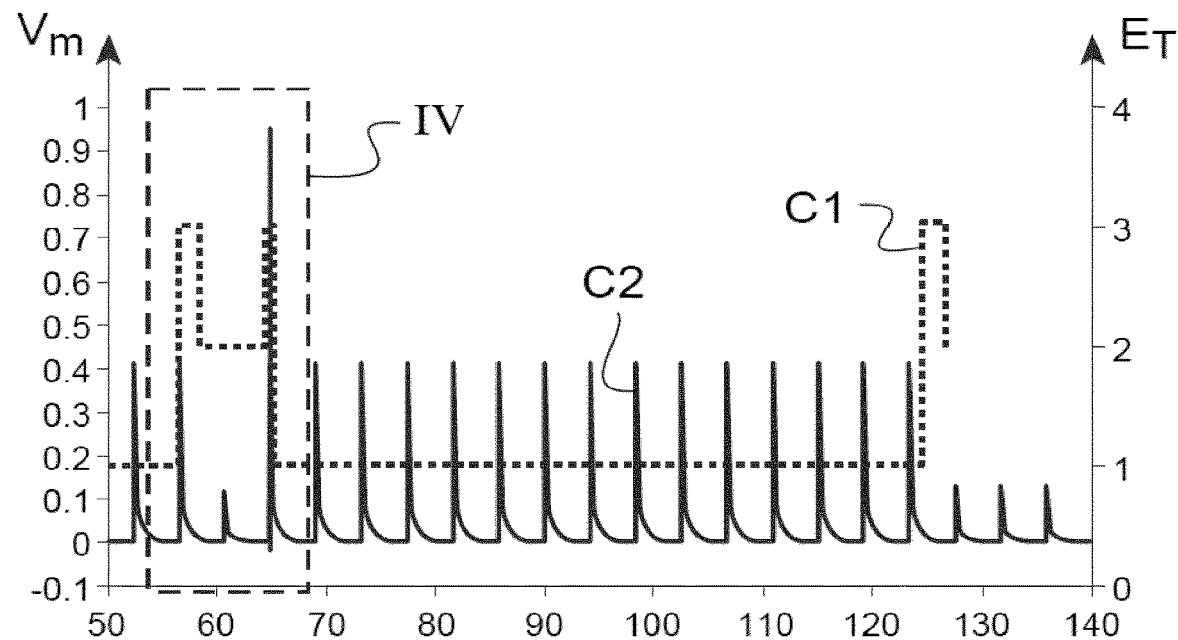
FIG. 3 is a graph illustrating, on the one hand, the state of a power relay connected to the DC voltage electrical source of FIG. 1 and, on the other hand, the variations of a voltage measured by the detection circuit of FIG. 2.
Figure 4:
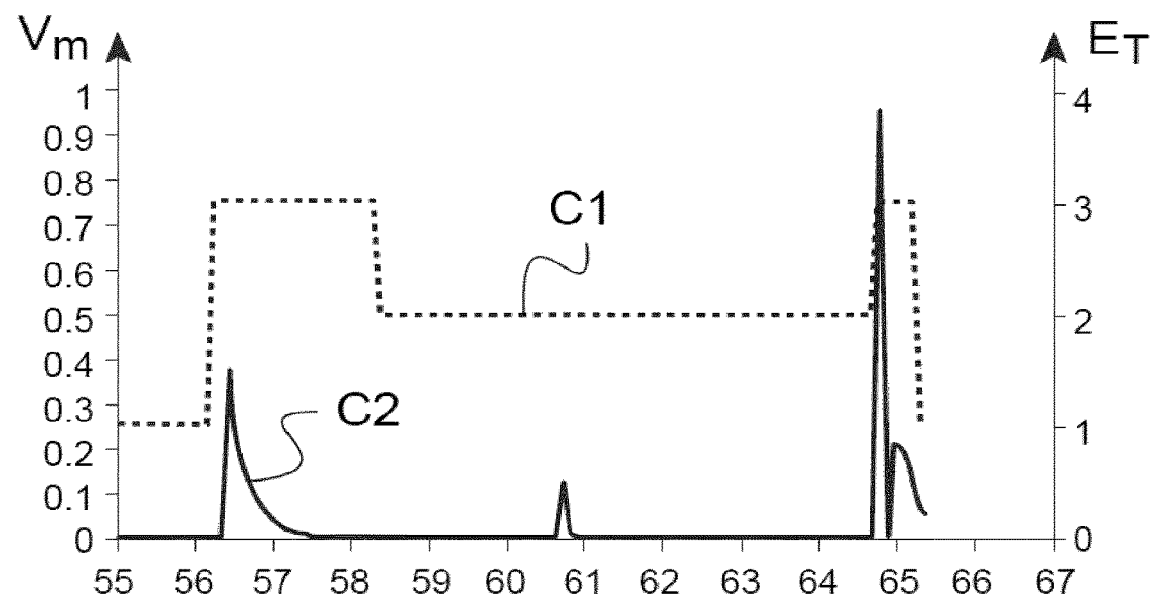
FIG. 4 is a detailed view of the zone IV of FIG. 3.

In FIG. 3, and in FIG. 4 which is a detail view of FIG. 3, the changes of states $E_T$ of these switches 33, 34 have been represented using the curve C1. This curve takes the value 1 when the switches are in the closed state, the value 2 in the open state, and the value 3 in the transient state.

The curve C2 represents the variations of the value $V_m$ of the measured voltage when the source 41 periodically establishes a same voltage at its terminals.

It is then observed, upon the closure of the switches 33, 34, that, during the transient states, the voltage $V_m$ is disturbed, which risks generating a false detection of a leakage current.

The second example of risky situations is linked to the charger of the traction battery 20.

If the motor vehicle 1 is of rechargeable electrical type, it is equipped with an electrical charger that makes it possible to recharge the accumulator battery 20 on an electrical outlet of a local electrical network (for example an outlet of a home). The terminals of this charger are then respectively connected to the terminals of the accumulator battery 20.

When the charger is connected to the local electrical network, the detection of an electrical insulation fault is no longer handled by the battery managing computer 50, but by a third-party computer with which the charger is equipped.

At the time of the switchover, the presence of a latency time is observed between the moment of physical connection of the charger to the overall electrical network and the moment of reception by the computer 50 of the request asking it to cease trying to detect an electrical insulation fault.

During this time interval, it is observed that the measured voltage $V_m$ is disturbed. This same kind of disturbance is observed after the charger has been physically disconnected from the local electrical network.

Figure 5:
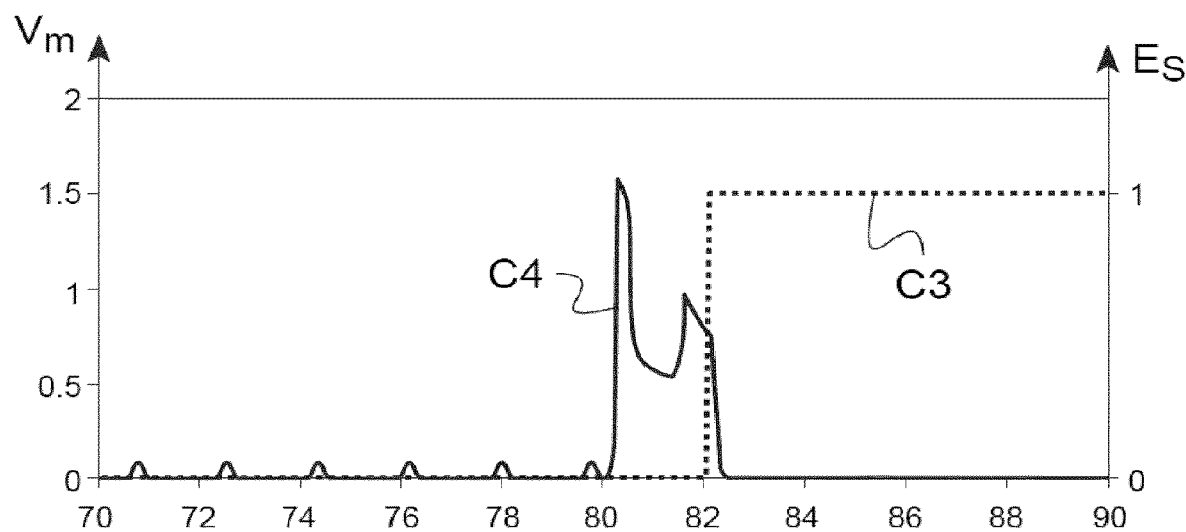
FIG. 5 is a graph illustrating, on the one hand, the state of a charger suitable for being connected to the DC voltage electrical source of FIG. 1, and, on the other hand, the variations of the voltage measured by the detection circuit of FIG. 2, upon the connection of the charger to the DC voltage electrical source.
Figure 6:
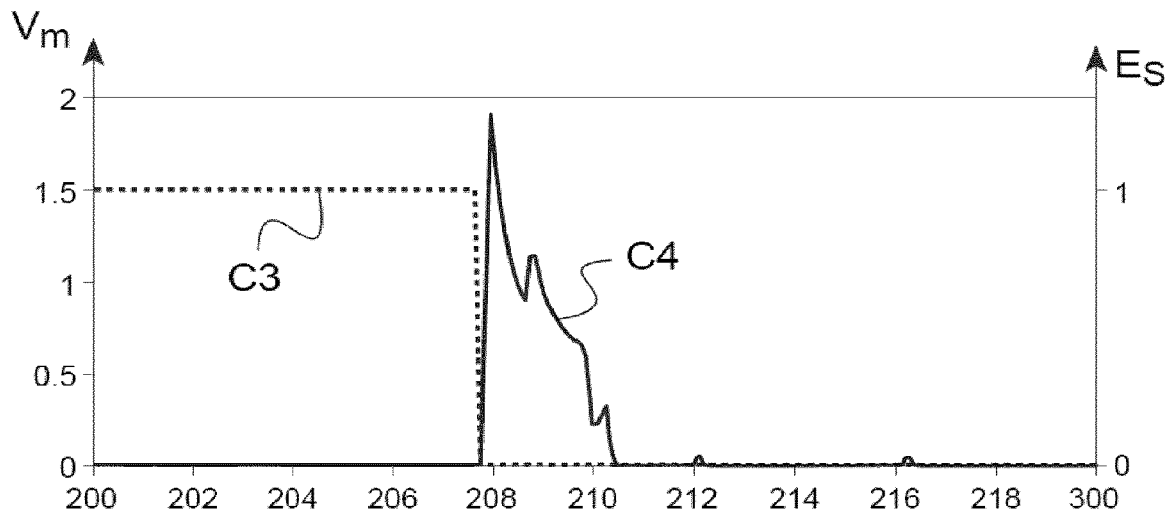
FIG. 6 is a graph illustrating, on the one hand, the state of the charger, and, on the other hand, the variations of the voltage measured by the detection circuit of FIG. 2, upon the disconnection of the charger from the DC voltage electrical source.

In FIGS. 5 and 6, the curve C3 is used to represent the connected or disconnected state $E_s$ of the charger. This curve takes the value 1 when the charger is connected to the local electrical network, and the value of 0 when it is disconnected. The curve C4 represents the variations of the measured voltage $V_m$.

It will be noted in these figures that, when the charger is in the disconnected state, the source 41 periodically establishes a voltage at its terminals to perform the detection of an electrical insulation fault. On the other hand, no voltage of this kind is established by the source 41 when the charger is connected.

It is then observed in FIG. 5 that, just before the computer 50 has received its request asking it to cease its monitoring, the voltage $V_m$ (used for the estimation of the value $R_i$ of the insulation resistance 66) is disturbed, which risks generating a false detection of an electrical insulation fault.

It is also observed in FIG. 6 that, just after the computer 50 has received its request asking it to resume its monitoring, the voltage $V_m$ is disturbed, which risks generating a false detection of an electrical insulation fault.

The present invention proposes identifying the risky situations (in which an electrical insulation fault risks being wrongly detected), using simple but effective criteria. It thus proposes identifying these risky situations based solely on the form of the variations of the measured voltage $V_m$ signal.

Figure 7:
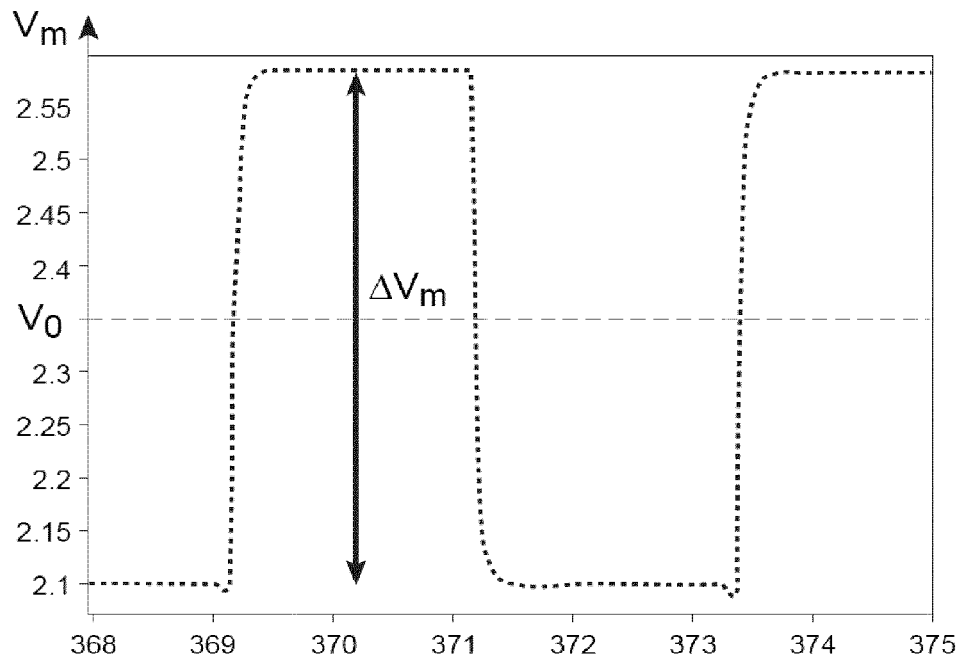
FIG. 7 is a graph illustrating an example of modeling of a variation of the voltage measured by the detection circuit of FIG. 2.

In FIG. 7, the appearance of the modeling of the voltage signal $V_m$ is represented when one or other of the abovementioned risky situations occurs. In these risky situations, this signal in fact increases rapidly then abruptly drops back.

To characterize the disturbances that are the source of a false detection of an electrical insulation fault, the present invention proposes being based on at least two parameters.

Here, preferentially, the checking of the validity of a detection of an insulation fault is based on the use of precisely two parameters.

Here, these two parameters are:
  the deviation of measured voltage $V_m$ between the two periods $T_1$, $T_2$, denoted $\Delta V_m$, and
  the average of the measured voltage $V_m$ between the two periods $T_1$, $T_2$, denoted $V_0$.

These two parameters are calculated by means of the following equations:

$$\Delta Vm = Vm2 - Vm1 \quad \text{[Math. 5]}$$

$$V_0 = \frac{(V_{m2} + V_{m1})}{2} \quad \text{[Math. 6]}$$

Each disturbance generates an abrupt variation of these two parameters. In monitoring, during the second phase of this method, the trend over time of these parameters, it is thus possible to check the reliability of the detection of the insulation fault performed during the first phase.

At this stage, it can be noted that these two parameters are directly linked to the value $R_i$ of the insulation resistance 66 and of the coefficient $\alpha$, according to the following equations:

$$\Delta V_m = \frac{R_m}{R_i + R_d + R_m} \Delta V_d \quad \text{[Math. 7]}$$

$$\alpha = \beta V_0 + \gamma \quad \text{[Math. 8]}$$

In these equations, the variables $\beta$ and $\gamma$ are defined thus:

$$\beta = \frac{2\Delta U_d}{U_{bat} \Delta V_m} \quad \text{[Math. 9]}$$

$$\gamma = \frac{U_{m2} U_{d2} - U_{m1} U_{d1}}{U_{bat} \Delta V_m} \quad \text{[Math. 10]}$$

Figure 8:
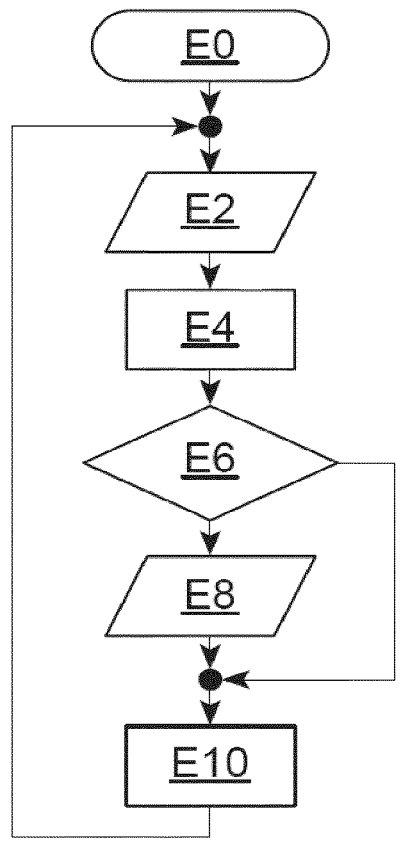
FIG. 8 is a flow diagram illustrating the steps of a method according to the invention.

It is now possible to describe, with reference to FIG. 8, how the second phase is implemented, after its initialization in step E0.

During a first step E2, the computer 50 acquires the two voltage values $Vm_1$, $Vm_2$ previously measured. It also acquires the values (denoted $\Delta V_{m,t-1}$, $V_{0,t-1}$) of the two parameters $\Delta V_m$, $V_0$ calculated in the preceding time interval.

Then, during a second step E4, the computer calculates the instantaneous values (denoted $\Delta V_{m,t}$, $V_{0,t}$) of the two parameters $\Delta V_m$, $V_0$.

During a third step E6, the computer 50 observes the variations in time of the two parameters in order to detect whether there is a risky situation of false detection of an electrical insulation fault.

For that, it compares, here respectively, the variations of each of the two parameters between the two time intervals with two thresholds S1, S2. In other words, it checks whether the following two inequalities are borne out:

$$|\Delta V_{m,t} - \Delta V_{m,t-1}| \leq S1 \quad \text{[Math. 11]}$$

$$|V_{0,t} - V_{0,t-1}| \leq S2 \quad \text{[Math. 12]}$$

The computer 50 then deduces from the result of these two inequalities, the level of reliability of the insulation resistance value Ri obtained during the first phase of the method. This level of reliability is, here, of Boolean type and can take two states "reliable" and "not reliable".

In practice, the computer 50 can be programmed in different ways to use the abovementioned two inequalities.

In a first embodiment, it is programmed to check whether one or less of these two inequalities is false.

If such is the case, the computer 50 considers the result of the first phase is not reliable. Consequently, no operation is undertaken on the basis of the value $R_i$ of the insulation resistance 66.

Otherwise, the result of the first phase is judged to be reliable. It is therefore used during a step E8. For that, the computer stores the value $R_i$ of the insulation resistance 66 and of the coefficient $\alpha$, and these data are then used to control, for example, the opening of the switch or switches 33, 34.

The method is then completed during the step E10.

In a second embodiment, the computer 50 is programmed to check whether these two inequalities are simultaneously false. If such is the case, it considers that the result of the first phase is not reliable. Otherwise, the result of the first phase is judged to be reliable.

The present invention is in no way limited to the embodiments described and represented, but the person skilled in the art will be able to add any variant that conforms to the invention.

For example, the second phase could be implemented before the first phase, and the implementation of the first phase could be conditioned on the result of the second phase.

In other words, it is possible, before calculating the value $R_i$ of the insulation resistance 66 and of the coefficient $\alpha$, to determine whether or not there is a situation with risk of false detection. For that, the computer checks whether one or both of the two abovementioned inequalities are borne out. Then, if there is a risky situation, not other action is undertaken. Otherwise, the computer 50 calculates the value $R_i$ of the insulation resistance 66 and of the coefficient $\alpha$ then it directly uses these data.

According to another variant of the invention, the two parameters used could be different from those used in the embodiment described. In the embodiment described, the two parameters $\Delta V_m$, $V_0$ are characteristics of the measured voltage $V_m$ signal. As a variant, these two parameters could be simple functions of the values of the measured voltage $V_m$. As an example, these two parameters could be formed by the value $R_i$ of the insulation resistance 66 and by that of the coefficient $\alpha$.

According to yet another variant of the invention, the abovementioned two inequalities could be based on the variations of the two parameters, not between two successive time intervals, but between a greater number of time intervals.

According to yet another variant of the invention, the abovementioned two inequalities could be based not on the variants of the two parameters in time, but on the values of these two parameters.

The invention claimed is:

1. A method for detecting an electrical insulation fault between an electrical power source and an electrical ground, via a circuit that comprises a controllable voltage generator and an electrical measurement resistor connected in series between a terminal of the electrical power source and the electrical ground, and which also comprises a measurement device configured to measure a voltage at terminals of the electrical measurement resistor, said method comprising:
controlling the voltage generator in such a way that the voltage generator establishes, between its terminals, a voltage of non-zero value;
measuring the voltage at the terminals of the electrical measurement resistor to detect an electrical insulation fault between the electrical power source and the electrical ground; and
checking, which includes a computer:
determining, as a function at least of the voltage measured at the terminals of the electrical measurement resistor, at least two parameters characteristic of a voltage disturbance affecting the detection of the electrical insulation fault, and
calculating a level of reliability of the detection of the electrical insulation fault as a function of at least one of the two parameters,
wherein one of the parameters is a function of an arithmetic mean between two measured values of the voltage at the terminals of the electrical measurement resistor, and/or a function of a deviation between the two measured values of the voltage at the terminals of the electrical measurement resistor.

2. The detection method as claimed in claim 1, wherein there is provided, between the measuring and the checking, detecting the electrical insulation fault and wherein the result of said detecting is used or not depending on the calculated level of reliability.

3. The detection method as claimed in claim 1, further comprising, after the checking, detecting the electrical insulation fault only when the level of reliability indicates that the detection of the electrical insulation fault will be reliable.

4. The detection method as claimed in claim 1, wherein, to detect an electrical insulation fault, the computer calculates a value of an insulation resistance of said electrical power source with respect to the electrical ground and then compares said value with a threshold.

5. The detection method as claimed in claim 1, wherein, when an electrical insulation fault is detected, the computer calculates a coefficient of positioning of the electrical insulation fault within said electrical power source.

6. The detection method as claimed in claim 1, wherein the calculating the level of reliability is done as a function of the two parameters.

7. The detection method as claimed in claim 1, wherein the calculating the level of reliability is done as a function of a variation in time of at least one of the two parameters.

8. The detection method as claimed in claim 1, wherein:
the voltage generator is controlled in such a way that the voltage between the terminals of the voltage generator takes, during two successive periods, two non-zero and mutually different values,
two values of the voltage at the terminals of the electrical measurement resistor are respectively measured during the two periods, and
each parameter of the two parameters is determined as a function of the two measured values.

9. A detection device to detect an electrical insulation fault between an electrical power source and an electrical ground, comprising:
a circuit that comprises a controllable voltage generator and an electrical measurement resistor connected in series between a terminal of the electrical power source and the electrical ground, and which comprises a measuring device configured to measure an intensity of a current circulating through the electrical measurement resistor, and
a computer configured to implement the detection method as claimed in claim 1.

10. A motor vehicle comprising:
an electrical power source;
an electrical ground; and
the detection device according to claim 9.

11. The detection method as claimed in claim 1, wherein the calculating the level of reliability comprises comparing respective differences between the two parameters at two time points to respective thresholds.

12. The detection method as claimed in claim 11, wherein the level of reliability is determined to be reliable if each of the differences are no more than the respective thresholds.

13. The detection method as claimed in claim 11, wherein the level of reliability is determined to be unreliable if one of the differences is greater than the respective threshold.

* * * * *